(12) United States Patent
Moreland

(10) Patent No.: US 6,753,732 B1
(45) Date of Patent: Jun. 22, 2004

(54) ACCURATE, WIDE-BAND, LOW-NOISE VARIABLE-GAIN AMPLIFIER STRUCTURES AND GAIN CONTROL METHODS

(75) Inventor: Carl W. Moreland, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/364,163

(22) Filed: Feb. 10, 2003

(51) Int. Cl.[7] .............................................. H03F 3/45
(52) U.S. Cl. ..................................... 330/261; 330/285
(58) Field of Search ............................... 330/254, 261, 330/278, 285, 296

(56) References Cited

U.S. PATENT DOCUMENTS

| | | |
|---|---|---|
| 5,581,212 A | 12/1996 | Huang et al. |
| 5,684,431 A | 11/1997 | Gilbert et al. |
| 5,717,360 A | 2/1998 | Vu et al. |
| 5,838,194 A | 11/1998 | Khoury |
| 6,483,383 B2 * | 11/2002 | Wu .............................. 330/261 |
| 6,559,720 B1 * | 5/2003 | Huijsing et al. ............ 330/259 |

* cited by examiner

Primary Examiner—Khanh Van Nguyen
(74) Attorney, Agent, or Firm—Koppel, Jacobs, Patrick & Heybl

(57) ABSTRACT

Variable-gain amplifiers (VGAs) are provided that realize gain accuracy (e.g., over variations in temperature and fabrication processes) while also providing this accuracy over a wide bandwidth and without the signal-to-noise degradation typically associated with signal attenuating elements. Differential signal and gain amplifiers of these VGAs include current sources which are controlled by a common error signal $S_{err}$. The gain amplifier is supplemented by feedback structure that generates the error signal $S_{err}$ and controls the amplifier's transconductance to be the ratio of at least one of currents and resistors. Because such ratios can be well matched (especially in integrated circuit realizations of the variable-gain amplifiers) and because the current source of the signal amplifier is also controlled by the error signal $S_{err}$, this wide-band, low-noise open-loop amplifier's gain is accurately controlled.

25 Claims, 4 Drawing Sheets

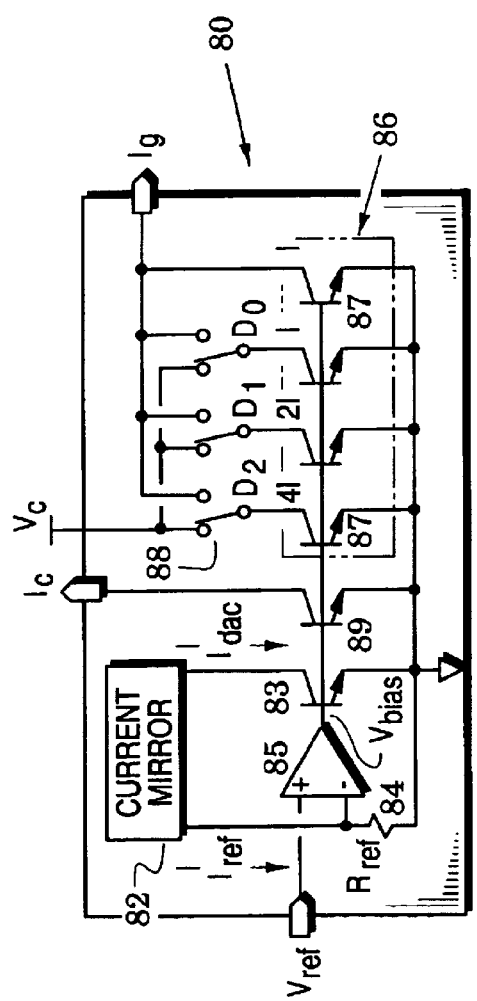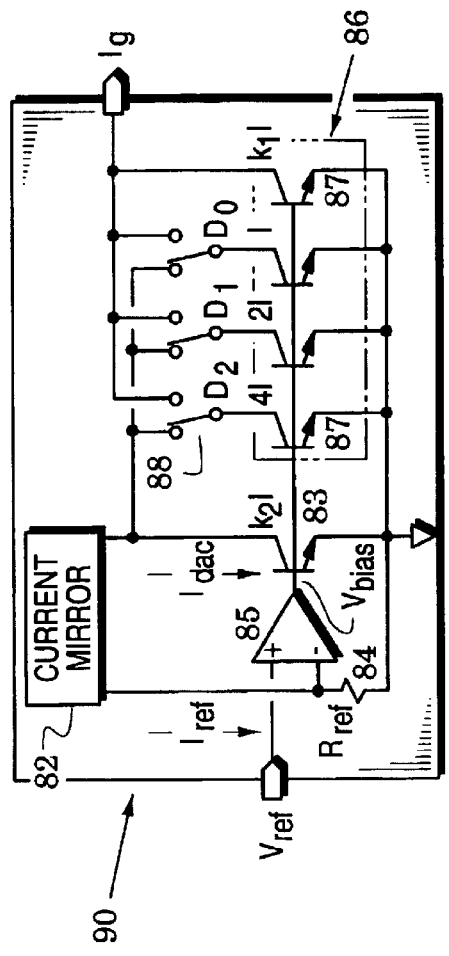
FIG. 3A
FIG. 3B

US 6,753,732 B1

ACCURATE, WIDE-BAND, LOW-NOISE VARIABLE-GAIN AMPLIFIER STRUCTURES AND GAIN CONTROL METHODS

BACKGROUND OF THE INVENTION

1. Field of the Invention

The present invention relates generally to variable-gain amplifiers.

2. Description of the Related Art

Variable-gain amplifiers (VGAs) are especially useful for precise control of signal levels in a wide variety of communication systems (e.g., in transmitters and receivers of mobile handsets). Although a large variety of VGA structures have been proposed, they generally fall in either a closed-loop or an open-loop category.

Realizing VGAs with feedback signals in a closed-loop configuration typically enhances gain accuracy (e.g., gain over temperature and fabrication process variations) at the expense of operational bandwidth. In contrast, realizing VGAs without feedback (i.e., in an open-loop configuration) has typically enhanced operational bandwidth but degraded gain accuracy.

Open-loop VGAs, for example, have been configured with input attenuators (e.g., resistive networks) that are succeeded by wideband, fixed-gain amplifiers. Typically, transistor or diode switches permit signals from successive portions of the input attenuator to be selectively coupled to the succeeding amplifier which provides the VGA's output signal. These arrangements, however, degrade the VGA's signal-to-noise performance because they attenuate the input signal relative to the inherent noise that resides at the amplifier's input.

Accordingly, a need exists for wide-band, low-noise VGAs that can also provide excellent gain accuracy over variations in temperature and fabrication processes

BRIEF SUMMARY OF THE INVENTION

The present invention is directed to variable-gain amplifiers that provide gain accuracy (e.g., over variations in temperature and fabrication processes) while also providing this accuracy over a wide bandwidth and without the signal-to-noise degradation typically associated with signal attenuating elements.

These goals are realized with differential signal and gain amplifiers that include current sources which are controlled by a common error signal $S_{err}$. The gain amplifier is supplemented by feedback structure that generates the error signal $S_{err}$ and controls the amplifier's transconductance to be the ratio of at least one of currents and resistors. Because such ratios can be well matched (especially in integrated circuit realizations of the variable-gain amplifiers) and because the current source of the signal amplifier is also controlled by the error signal $S_{err}$, this wide-band, low-noise open-loop amplifier's gain is accurately controlled.

The novel features of the invention are set forth with particularity in the appended claims. The invention will be best understood from the following description when read in conjunction with the accompanying drawings.

BRIEF DESCRIPTION OF THE DRAWINGS

FIGS. 3A and 3B are schematics of digital-to-analog converter embodiments that can be used to realize other embodiments of the variable-gain amplifier of FIG. 1.

DETAILED DESCRIPTION OF THE INVENTION

Figure 1:
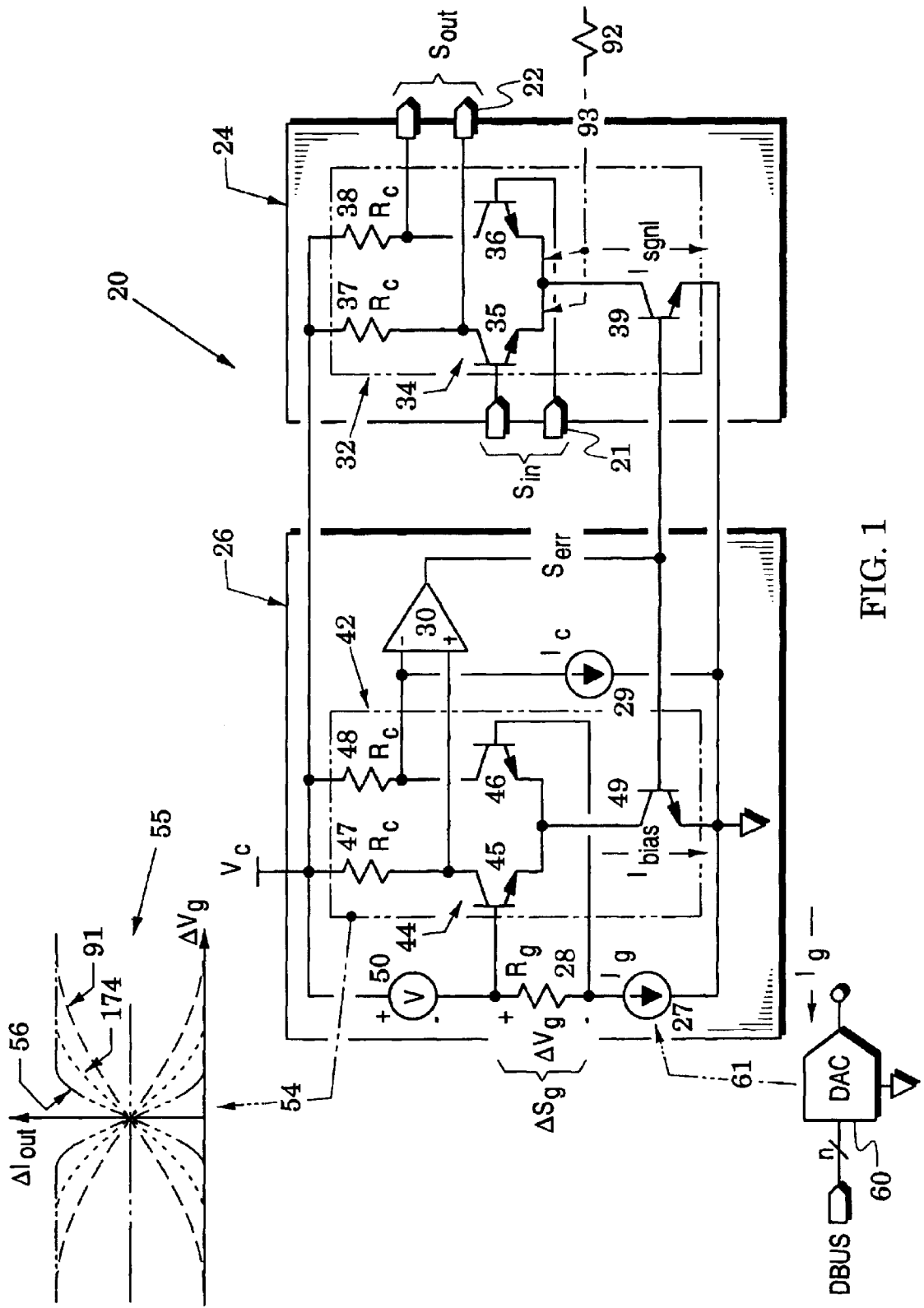
FIG. 1 is a schematic of a variable-gain amplifier embodiment of the present invention.

The variable-gain amplifier (VGA) 20 of FIG. 1 is illustrative of VGA's of the present invention which achieve the bandwidth of open-loop amplifiers and the gain accuracy of closed-loop amplifiers. Because the structure of these VGAs do not position attenuating elements prior to signal amplification, they also avoid the signal-to-noise degradation of such elements.

In particular, FIG. 1 illustrates a VGA 20 of the present invention which comprises a signal amplifier 24 and a bias amplifier 26 that includes a gain current source 27, a gain resistor 28, a control current source 29 and an error amplifier 30. The signal amplifier 24 includes differential input port 21 and a differential output port 22 and the VGA 20 provides a signal gain between a differential input signal $S_{in}$ at the differential input port and a differential output signal $S_{out}$ at the differential output port wherein the signal gain varies in correspondence to a gain signal.

The signal amplifier 24 is formed with a signal differential amplifier 32 that is coupled between the differential input port 21 and the differential output port 22. The signal differential amplifier 32 includes a signal differential pair 34 of signal transistors 35 and 36 that is coupled between first and second signal loads 37 and 38 and a signal current source 39. In the embodiment of FIG. 1, the first and second signal loads are resistors and the signal current source is a transistor whose control terminal (i.e., a base) is available to receive an error signal $S_{err}$.

The bias amplifier 26 is formed with a bias differential amplifier 42. Although this differential amplifier is substantially identical to the signal differential amplifier 32, it is generally identified for descriptive purposes by replacement of the adjective "signal" with the adjective "bias". Thus, the bias differential amplifier 42 includes a bias differential pair 44 of bias transistors 45 and 46 that is coupled between first and second bias loads 47 and 48 and a bias current source 49. Similar to the signal differential amplifier 32, the first and second bias loads are resistors and the bias current source is a transistor whose control terminal is available to receive the error signal $S_{err}$.

The gain resistor 26 of the bias amplifier 26 has a gain resistance $R_g$ and is coupled across the differential input of the bias differential pair 44 and receives the gain current $I_g$ of the gain current source 27 to thereby generate a differential gain signal $\Delta S_g$ (in particular, a differential gain voltage $\Delta V_g$). A voltage source 50 is coupled to one side of the gain resistor 28 to establish an operational signal level at the differential input of the bias differential pair 44. Finally, it is noted that the error amplifier 30 has a differential input coupled to receive a difference signal from the first and second bias loads 47 and 48 and an output coupled to provide the error signal $S_{err}$ to the control terminals of the signal and bias current sources 39 and 49.

To enhance the following operational description of the bias amplifier 26, an broken-line arrow 54 indicates that the bias differential amplifier 42 operates in accordance with a transconductance ($g_m$) graph 55. In response to the differential gain voltage $\Delta V_g$, the differential output current $\Delta I_{out}$ of the bias differential pair 44 will be given by the transconductance plot 56 which is linear over a limited region (e.g., a region on the order of $\pm V_T$ wherein $V_T$ is the thermal voltage kT/q wherein k is Boltzman's constant and q is electron charge). The bias differential pair 44 will thus attempt to establish a differential voltage across the differential input of the differential amplifier 30 equal to $g_m \Delta V_g R_c$ wherein $R_c$ is the resistance of each of the collector bias loads 47 and 48.

However, the bias load 48 also receives the control current $I_c$ of the control current source 29 which attempts to establish a voltage $I_c R_c$ across the bias load 48. A difference signal is thus established across the input of the error amplifier 30 and the error signal $S_{err}$ of the error amplifier is coupled as a feedback signal to the control terminal of the bias current source 49. Because the error amplifier has a substantial gain, the feedback operates to reduce the difference signal substantially to zero so that $g_m \Delta V_g R_c = I_c R_c$ and, therefore, $$g_m = I_c / \Delta V_g = I_c / (I_g R_g). \tag{1}$$

The error amplifier 30, however, also provides its error signal $S_{err}$ to the control terminal of the signal current source 39 so that the transconductance of the signal differential amplifier 32 will also be controlled in accordance with the relationship of equation (1). Because the inherent voltage gain of the signal differential amplifier 42 is $g_m R_c$, its controlled gain $A_V$ is thus forced by the controlled feedback to be $$A_V = I_c R_c / (I_g R_g). \tag{2}$$

Equation (2) shows that the voltage gain of the signal differential amplifier 32 is feedback controlled to be the ratio of two resistors and the ratio of two currents.

In an important feature of the present invention, equation (2) also shows that the voltage gain can be varied by varying one or both of the control and gain currents $I_c$ and $I_g$. In an important advantage of the invention, this gain will be substantially independent of temperature and process variations because it is a function of resistor and current ratios which can be especially well matched in integrated circuit realizations of the VGA 20 (e.g., by forming the resistors of closely-spaced like materials and by deriving the currents from a common bias).

In contrast to the feedback-controlled bias amplifier 26, the signal amplifier 24 is an open-loop amplifier whose voltage gain can thus have an extremely wide bandwidth (e.g., on the order of 1 GHz). In the absence of the control methods of the invention, this voltage gain would be sensitive to temperature and process variations. Because the gain of the signal differential amplifier 32 is controlled in accordance with equation (2), however, the gain is determined by the ratio of two resistors and the ratio of two currents. In another important feature of the present invention, therefore, the signal amplifier 24 has the bandwidth advantages of an open-loop structure but the gain-immunity of a feedback-controlled amplifier to temperature and process variations.

The transconductance plot 56 of the graph 55 also applies to the signal amplifier 24 wherein the horizontal axis would be the input signal $S_{in}$ at the differential input port 21. The transconductance plot 56 thus indicates that the transconductance $g_m$ of the signal amplifier 24 will vary with variations of its input signal and only matches the transconductance $g_m$ of the bias amplifier 26 when the input signal $S_{in}$ matches the differential gain signal $\Delta S_g$ at the input of the bias amplifier 26. Preferably, therefore, the product $I_g R_g$ should be chosen to substantially match the expected level of the input signal $S_{in}$. If the input signal $S_{in}$ has a substantial variation, the product $I_g R_g$ should generally be chosen to match the peak level of the input signal $S_{in}$.

As previously stated, either of the gain and control currents $I_g$ and $I_c$ can be varied to vary the gain of the signal amplifier 24 but that variation will alter the input signal level at which the gain of the signal amplifier 24 is accurately controlled. It is noted that a high gain of the signal amplifier 24 implies a small input signal $S_{in}$ while a low gain implies a large input signal $S_{in}$. Because the transconductance plot 56 of the graph 55 shows that transconductance $g_m$ increases with reduced differential gain voltage $\Delta V_g$, varying the gain current $I_g$ will have the benefit that the differential gain voltage $\Delta V_g$ will substantially track the expected input signal $S_{in}$ to thereby maintain gain accuracy.

For example, reducing the gain current $I_g$ will increase (see equation (2)) the voltage gain $A_v$ of the signal differential amplifier 32 at a time that its input signal $S_{in}$ is expected to reduce. Reducing the gain current $I_g$, however, also reduces the differential gain voltage $\Delta V_g$ at the input of the bias differential amplifier 42. Accordingly, the signal level reduces at the input of both of the signal and gain differential amplifiers 32 and 42 which enhances the tracking between the signal levels of these amplifiers.

In another important feature of the present invention, therefore, the voltage gain of the open loop signal amplifier 24 is varied by varying the gain current $I_g$ of the gain current source 27. FIG. 1 shows an amplifier embodiment in which this feature is realized by substituting (indicated by broken-line substitution arrow 61) a current-mode digital-to-analog converter (DAC) 60 for the gain current source 27. The DAC 60 varies the gain current $I_g$ in accordance with a digital code (e.g., n-bit words received over a data buss DBUS) so that the voltage gain $A_v$ of the signal differential amplifier 32 is controlled by the digital code.

Figure 2:
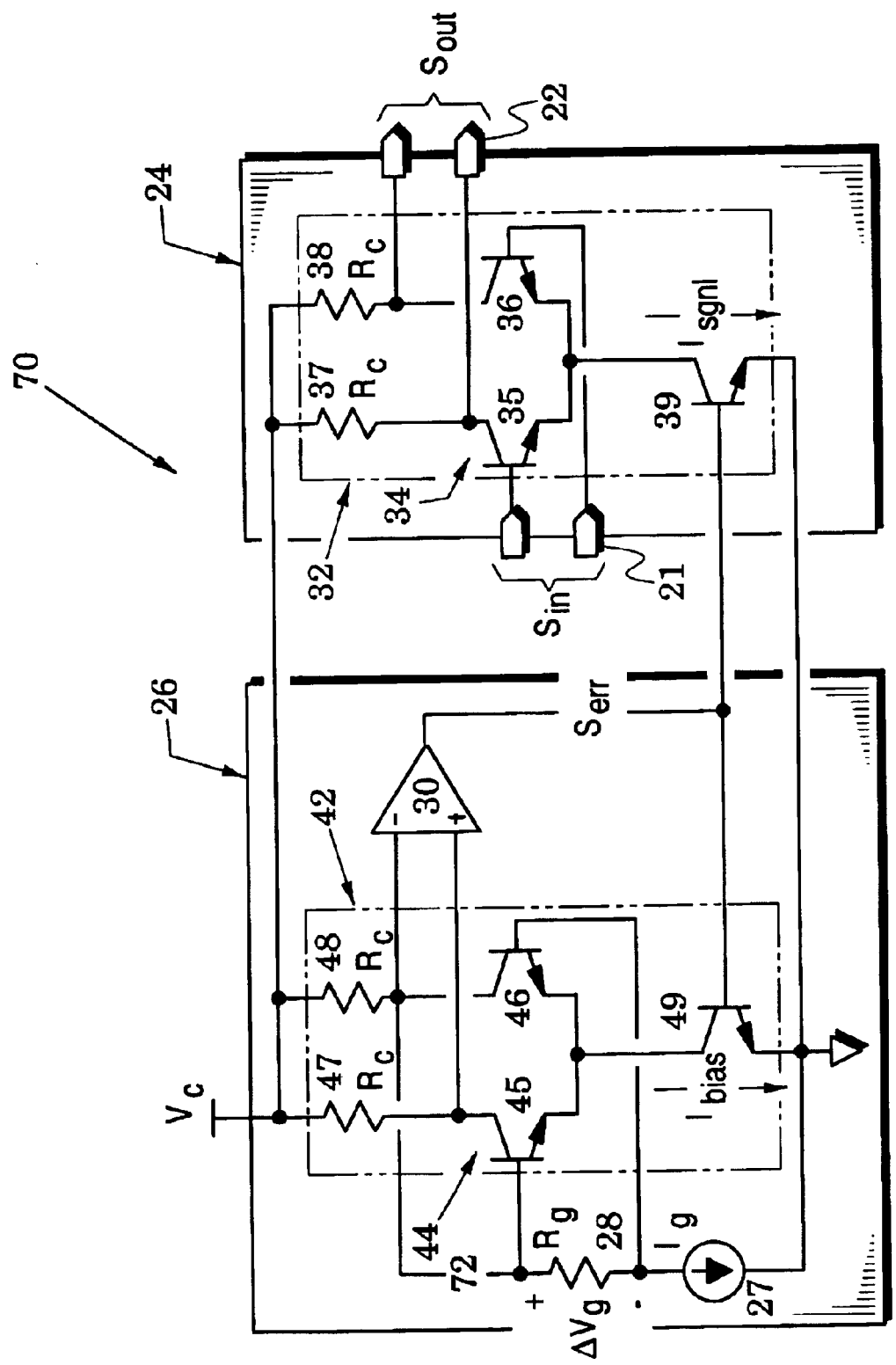
FIG. 2 is a schematic of another variable-gain amplifier embodiment.

FIG. 2 illustrates another VGA embodiment 70 which includes elements of the VGA 20 of FIG. 1 with like elements indicated by like reference numbers. In the VGA 70, the control current source (29 in FIG. 1) and the voltage source (50 in FIG. 1) are removed and the inverting input of the error amplifier 30 is coupled via a signal path 72 to the upper side of the gain resistor 28. Because the input impedance of the bias differential pair 44 is quite high, the control current $I_c$ of FIG. 1 has now been substantially replaced by the gain current $I_g$ of the gain current source 27.

Because the current source coupled to the inverting input of the differential amplifier 30 is now the gain current $I_g$, the voltage gain of equation (2) reduces to a voltage gain of $$A_v = R_c / R_g. \tag{3}$$

so that the gain of the VGA 70 is controlled by the ratio of two resistors. The gain amplifier 24 is thus an open-loop amplifier with an accurate, fixed gain set by equation (3). Varying the gain current $I_g$ alters the differential gain signal $\Delta S_g$ which is the input signal level at which the gain of the gain amplifier 24 faithfully follows equation (3). In contrast to the VGA 20 of FIG. 1, the VGA 70 only requires a single current source for its operation.

Different embodiments of the VGA 20 of FIG. 1 may be realized with different embodiments of the current-mode DAC 60. One current-mode DAC embodiment 80 is shown in the exemplary 3-bit structure of FIG. 3A. The DAC 80 has a current mirror 82 that receives a dac current $I_{dac}$ from a bias transistor 83 and mirrors this to a reference current $I_{ref}$ that flows across a reference resistor 84 at one input of a differential amplifier 85. At another input, the differential amplifier receives a reference voltage $V_{ref}$. In operation, the feedback action of the current mirror 82 will adjust a bias voltage $V_{bias}$ at the differential amplifier's output to a value at which the DAC current $I_{dac}$ through the bias transistor 83 is $V_{ref}/R_{ref}$.

The control terminal (i.e., base) of the bias transistor 83 is coupled to the control terminals of a set 86 of current-source transistors 87 so that their currents will be related to that of the bias transistor 83 by the ratio of their respective emitter areas to that of the bias transistor (typically, the bias transistor and the current-source transistors are realized with different numbers of unit transistors). The currents of the current-source transistors 87 are switched by switches 88 from a supply voltage $V_c$ to form the gain current $I_g$ (27 in FIG. 1) in response to a digital code D0–D2.

In the exemplary 3-bit DAC of FIG. 3A, a first unswitched current-source transistor provides a current I and the remaining switched current-source transistors have binarily-scaled currents so that the current-mode DAC 80 generates a current I for a digital code 000 and a current 81 for a digital code 111. A control transistor 89 also has a control terminal coupled to the control terminal of the bias transistor 83 and the control transistor thus provides the fixed control current $I_c$ of the control current source 29 of FIG. 1.

The DAC 80 of FIG. 3A provides a linear output in response to a digital code. FIG. 3B illustrates another useful current-mode DAC 90 which provides an output current that varies logarithmically in response to the digital code. The DAC 90 includes elements of the DAC 80 with like elements indicated by like reference numbers. In contrast, however, the switches 88 are arranged to couple the currents of the current-source transistors 87 back to the input of the current mirror 82 rather than to the supply voltage $V_c$ (as in the DAC 80 of FIG. 3A).

In operation, the feedback action of the current mirror 82 will now adjust the bias voltage $V_{bias}$ at the differential amplifier's output to a value at which the sum of the dac current $I_{dac}$ and the unswitched currents from the current-source transistors 87 is equal to $V_{ref}/R_{ref}$. The value of the bias voltage $V_{bias}$ and the current through each of the current-source transistors 87 now varies depending on the present state of the switches 88.

This DAC arrangement produces a quasi-logarithmic current (i.e., a first-order approximation of a logarithmic current) in response to the digital code. A first one of the current-source transistors 87 preferably has a current $k_1 I$ and the bias transistor 83 has a current $k_2 I$ wherein the constants $k_1$ and $k_2$ are selected to optimally fit the gain current $I_g$ to a logarithmic curve. Because the bias voltage $V_{bias}$ is no longer fixed, a separate current source must be used to provide the control current $I_c$ for the VGA 20 of FIG. 1.

When the DAC 90 of FIG. 3B is substituted for the DAC 60 of FIG. 1, the VGA 20 provides an output signal from its output port 22 that varies logarithmically in response to a linear variation in the data bus signal DBUS. This variation is typically referred to as a "linear in dB" response.

The transconductance plot 56 of the graph 55 in FIG. 1 illustrates that the transconductance of a differential pair is linear over a limited region of the differential gain voltage $\Delta V_g$. This limited region can be significantly increased as exemplified by transconductance plot 91 of the graph 65 by insertion of degeneration resistors. This process is exemplified by insertion of a degeneration resistor 92 into each current terminal (emitter) of the transistors 35 and 36 of the differential pair 34 in the signal differential amplifier 32 of FIG. 1 as indicated by the broken-line insertion arrow 93.

The linear region can be further expanded by the use of multi-tanh differential structures as described below with respect to FIG. 4.

Figure 4:
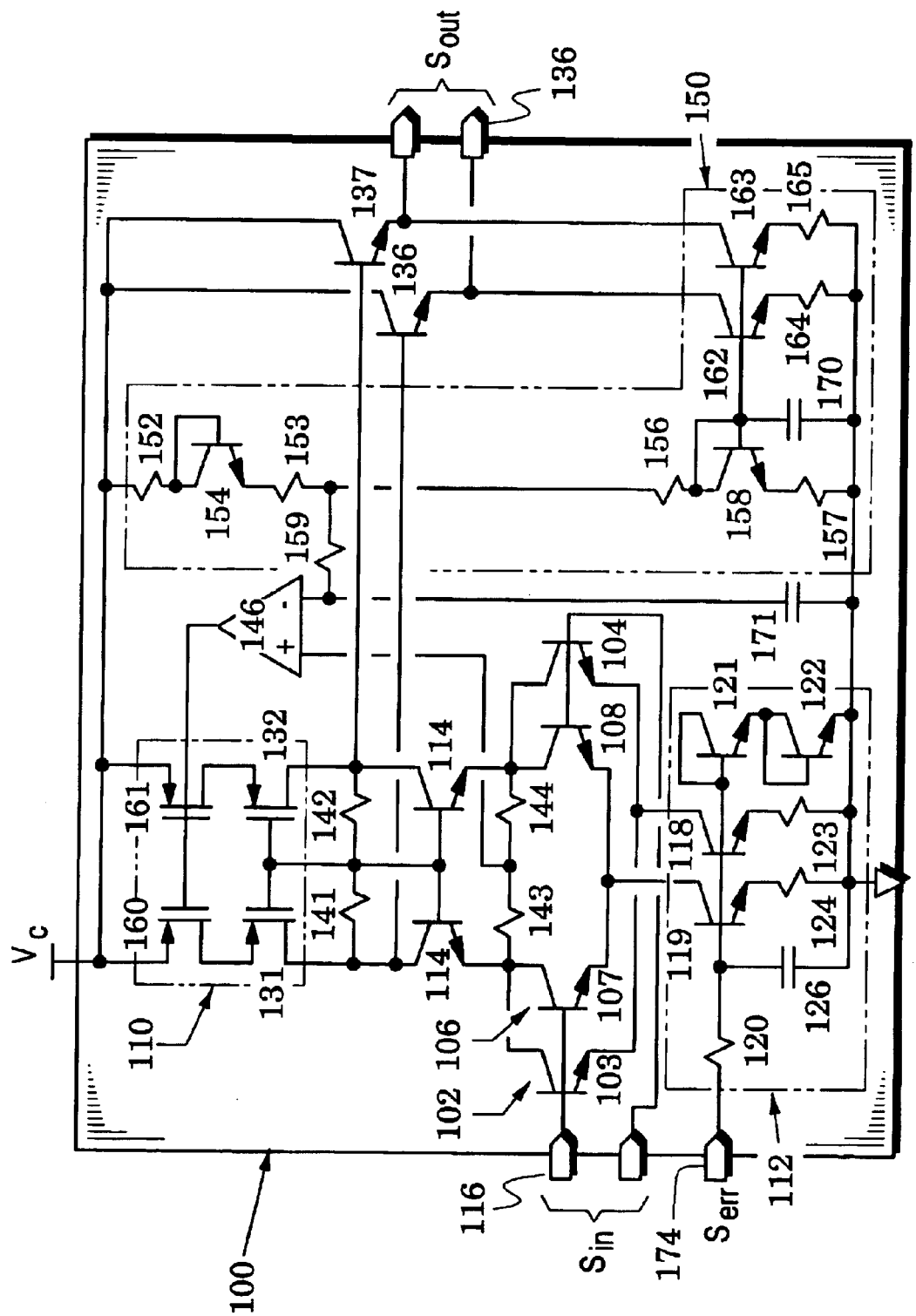
FIG. 4 is a schematic of a differential amplifier embodiment for use as signal and bias amplifiers in the variable-gain amplifier embodiments of FIGS. 1 and 2.

FIG. 4 illustrates a differential amplifier embodiment 100 which is particularly suited for use as the signal differential amplifier 32 and the bias differential amplifier 42 in the VGAs 20 and 70 of FIGS. 1 and 2. The differential amplifier 100 has a first differential pair 102 of transistors 103 and 104 and a second differential pair 106 of transistors 107 and 108 that are coupled in parallel between high-impedance current sources 110 and a current source 112 with a cascode pair 114 of transistors inserted for isolation between the first and second pairs 102 and 106 and the high-impedance current sources. These elements correspond, for example, to the signal differential pair 34 of signal transistors 35 and 36, the first and second signal loads 37 and 38 and the signal current source 39 of the signal differential amplifier (32 in FIG. 1).

Transistors 103 has a current terminal (emitter) area that is n times the current terminal area of transistor 104 and transistor 108 has a current terminal area that is n times the current terminal area of transistor 107 wherein n is greater than one (e.g., n=3). Parallel arrangements of differential pairs with nonequal current terminal areas are generally referred to as multi-tanh (i.e., hyperbolic tangent) structures which have been found to be particularly effective at expanding the linear transconductance region of differential pairs. The control terminals of the first and second differential pairs 102 and 106 are coupled to receive an input signal $S_{in}$ from an input port 116.

The current source 112 includes first and second transistors 118 and 119 that are biased by a series connection of a resistor 120 and two diode-coupled transistors 121 and 122 with resistors 123 and 124 respectively inserted in series with the first and second transistors 118 and 119. A capacitor 126 is coupled to the control terminals of the first and second transistors 118 and 119 to reduce noise and spurious signals. The first and second transistors 118 and 119 are coupled to source current respectively to the first and second differential pairs 102 and 106.

Transistors 131 and 132 are part of the high-impedance current sources 110 and gain-setting resistors 141 and 142 (similar to the first and second bias loads 47 and 48 of FIG. 1) are coupled across these sources with the output signal coupled from them to an output port 136 through isolating emitter followers 136 and 137.

Resistors 143 and 144 are also coupled across the outputs of the first and second differential pairs 102 and 106 to receive a common-mode voltage that is controlled by a common-mode differential amplifier 146. A bias system 150 includes a series arrangement of resistors 152, 153 and diode-coupled transistor 154 which is coupled in series with another series arrangement of resistors 156, 157 and diode-coupled transistor 158 to establish a common-mode reference that is approximately ½ of the supply voltage $V_c$.

The transistors 131 and 132 are arranged in cascode with transistors 160 and 161 to complete the high-impedance current sources 110. A resistor 159 couples the common-mode reference to the inverting port of the differential amplifier 146 and the output of the differential amplifier is coupled to control terminals of the transistors 160 and 161.

The bias system 150 also includes current-source transistors 162 and 163 which are respectively coupled between resistors 164 and 165 and the emitter followers 136 and 137. The current-source transistors 162 and 163 are biased in common with the diode-coupled transistor 158. Finally a capacitor 170 is coupled to the current-source transistors 162 and 163 to reduce noise and spurious signals and a capacitor 171 is coupled to the inverting port of the differential amplifier 146 to enhance stability.

In operation, the feedback action of the differential amplifier 146 causes the common-mode voltage between the resistors 143 and 144 to be substantially equal to the common-mode reference (at resistor 159) of the bias system 150. The output signal $S_{out}$ at the output port 136 is generated by the first and second differential pairs 102 and 106 in response to the input signal $S_{in}$ at the input port 116.

In particular, the differential pairs 102 and 106 steer the currents of the current source 112 between resistors 141 and 142 to generate the output signal $S_{out}$. In this latter process, the multi-tanh structure of the first and second differential pairs 102 and 106 further broadens the linear transconductance region as exemplified by the transconductance plot 174 in the graph 55 of FIG. 1. When the differential amplifier embodiment 100 is used for the signal differential amplifier 32 of FIG. 2, the error signal $S_{err}$ from the differential amplifier 30 of FIG. 1 would be applied at the error port 174 of the current source 112.

Simulations have been run for an exemplary VGA of the invention that substituted the amplifier 100 of FIG. 4 for the signal and gain differential amplifiers 32 and 42 of FIG. 1 and used a 7-bit version of the DAC 90 of FIG. 3B for the DAC 60 of the amplifier 100. The simulations showed that the gain current $I_g$ from the simulated DAC closely followed a logarithmic plot over a gain range of 20–28 dB with 0.1 dB steps. The simulations further showed that the gain of the VGA was substantially constant over temperature and process variations and over a bandwidth of substantially 1 GHz.

The simulations therefore confirmed that VGA's of the invention achieve the bandwidth of open-loop amplifiers and the gain accuracy of closed-loop amplifiers. Because the signal is not attenuated prior to the input to the signal amplifier (24 in FIG. 1), noise performance is not degraded.

VGA embodiments of the invention have been illustrated with reference to specific transistor types (e.g., bipolar junction transistors and metal-oxide semiconductor (MOS) transistors) but the teachings of the invention can be practiced with various transistor types and various mixtures of transistor types.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An amplifier which provides a signal gain between a differential input signal and a differential output signal that corresponds to a gain signal, the amplifier comprising:
   a signal differential amplifier that has first and second signal loads and a signal current source that provides a signal current wherein said signal differential amplifier steers said signal current to said first and second signal loads in response to said differential input signal;
   a bias differential amplifier that has a bias differential input port, first and second bias loads and a bias current source that provides a bias current wherein said bias differential amplifier steers said bias current to said first and second bias loads when said gain signal is received at said bias differential input port;
   a control current source that drives a control current through one of said first and second bias loads; and
   an error amplifier coupled to respond to a difference signal between said first and second bias loads and, in response, adjust said signal and bias currents to reduce said difference signal;
   said differential output signal thereby generated across said first and second signal loads with said signal gain controlled by said gain signal.

2. The amplifier of claim 1, further including:
   a gain current source that provides a gain current; and
   a gain resistor positioned across said bias differential input port to receive said gain current and provide said gain signal.

3. The amplifier of claim 1, further including:
   a digital-to-analog converter that converts a digital code to a gain current; and
   a gain resistor positioned across said bias differential input port to receive said gain current and provide said gain signal.

4. The amplifier of claim 1, wherein said signal and bias current sources respectively comprise signal and bias transistors that respectively have signal and bias control terminals and an output of said error amplifier is coupled to said signal and bias control terminals.

5. The amplifier of claim 1, wherein said first and second signal loads and said first and second bias loads are resistive loads.

6. The amplifier of claim 1, wherein said first and second signal loads and said first and second bias loads are active loads.

7. An amplifier which provides a signal gain between a differential input signal and a differential output signal, the amplifier comprising:
   a signal differential amplifier that has first and second signal loads and a signal current source that provides a signal current wherein said signal differential amplifier steers said signal current to said first and second signal loads in response to said differential input signal;
   a bias differential amplifier that has a bias differential input port, first and second bias loads and a bias current source that provides a bias current wherein one of said bias loads is coupled to one side of said bias differential input port and said bias differential amplifier steers said bias current to said first and second bias loads in response to a gain signal at said bias differential input port;
   a gain current source that provides a gain current;
   a gain load positioned across said bias differential input port to receive said gain current and provide said gain signal; and
   an error amplifier coupled to respond to a difference signal between said first and second bias loads and, in response, adjust said signal and bias currents to reduce said difference signal;
   said differential output signal thereby generated across said first and second signal loads with a signal gain controlled by a ratio of one of said bias loads to said gain load.

8. The amplifier of claim 7, wherein said signal and bias current sources respectively comprise signal and bias transistors that respectively have signal and bias control terminals and an output of said error amplifier is coupled to said signal and bias control terminals.

9. The amplifier of claim 7, wherein said first and second signal loads, said first and second bias loads and said gain load are resistive loads.

10. The amplifier of claim 7, wherein said first and second signal loads and said first and second bias loads are active loads.

11. An amplifier which provides a signal gain between a differential input signal and a differential output signal that varies with a digital code, the amplifier comprising:

a signal differential amplifier that has first and second signal loads and a signal current source that provides a signal current wherein said signal differential amplifier steers said signal current to said first and second signal loads in response to said differential input signal;

a bias differential amplifier that has a bias differential input port, first and second bias loads and a bias current source that provides a bias current wherein said bias differential amplifier steers said bias current to said first and second bias loads in response to gain signals at said differential input port;

a digital-to-analog converter that converts said digital code to a gain current;

a gain resistor positioned across said bias differential input port to receive said gain current and provide said gain signals;

a control current source that drives a control current through one of said first and second bias loads; and an error amplifier coupled to respond to a difference signal between said first and second bias loads and, in response, adjust said signal and bias currents to reduce said difference signal;

said differential output signal thereby generated across said first and second signal loads with said signal gain controlled by said digital code.

12. The amplifier of claim 11, wherein said signal and bias current sources respectively comprise signal and bias transistors that respectively have signal and bias control terminals and an output of said error amplifier is coupled to said signal and bias control terminals.

13. The amplifier of claim 11, wherein:
said signal differential amplifier includes a signal differential pair of signal transistors coupled between said first and second signal loads and said signal current source; and
said bias differential amplifier includes a bias differential pair of bias transistors coupled between said first and second bias loads and said bias current source.

14. The amplifier of claim 11, wherein:
said signal differential amplifier includes a signal differential pair of signal transistors coupled to said first and second signal loads and first and further includes second signal degeneration resistors that couple said signal transistors to said signal current source; and
said bias differential amplifier includes a bias differential pair of bias transistors coupled to said first and second bias loads and further includes first and second bias degeneration resistors that couple said bias transistors to said bias current source.

15. The amplifier of claim 11, wherein:
said signal differential amplifier includes first and second signal differential pairs of signal transistors that each have signal current terminals wherein the areas of said signal current terminals differ in each of said first and second signal differential pairs; and
said bias differential amplifier includes first and second bias differential pairs of bias transistors that each have bias current terminals wherein the areas of said bias current terminals differ in each of said first and second bias differential pairs.

16. The amplifier of claim 11, wherein said first and second signal loads and said first and second bias loads are resistive loads.

17. The amplifier of claim 11, wherein said first and second signal loads and said first and second bias loads are active loads.

18. The amplifier of claim 11, wherein said digital-to-analog converter is configured to cause said gain current to have a substantially linear response to said digital code.

19. The amplifier of claim 11, wherein said digital-to-analog converter is configured to cause said gain current to have a substantially logarithmic response to said digital code.

20. A method of controlling a signal gain between a differential input signal and a differential output signal, the method comprising the steps of:

providing a signal differential amplifier that steers a signal current between first and second signal loads in response to said differential input signal;

providing a bias differential amplifier that has a bias differential input port and steers a bias current between first and second bias loads in response to a gain signal at said bias differential input port wherein one of said bias loads is coupled to one side of said bias differential input port;

providing a gain current;

receiving said gain current with a gain load positioned across said bias differential input port to generate a gain signal;

adjusting said bias current by a different current that reduces a difference signal between said first and second bias loads; and adjusting said signal current by substantially said difference current;

said differential output signal thereby generated across said first and second signal loads with said signal gain controlled by said gain signal.

21. The method of claim 20, wherein said first and second signal loads, said first and second bias loads and said gain load are resistive loads.

22. The method of claim 20, wherein said first and second signal loads and said first and second bias loads are active loads.

23. A method of controlling a signal gain between a differential input signal and a differential output signal in response to a gain signal, the method comprising the steps of:

providing a signal differential amplifier that steers a signal current between first and second signal loads in response to said differential input signal;

providing a bias differential amplifier that steers a bias current between first and second bias loads in response to said gain signal;

driving a control current through one of said first and second bias loads, adjusting said bias current by a different current that reduces a difference signal between said first and second bias loads; and adjusting said signal current by substantially said difference current;

said differential output signal thereby generated across said first and second signal loads with said signal gain controlled by said gain signal.

24. The method of claim 23, wherein said first and second signal loads, said first and second bias loads and said gain load are resistive loads.

25. The method of claim 23, wherein said first and second signal loads and said first and second bias loads are active loads.

* * * * *